United States Patent
Bhunia et al.

(10) Patent No.: US 10,006,720 B2
(45) Date of Patent: Jun. 26, 2018

(54) SYSTEM FOR USING ACTIVE AND PASSIVE COOLING FOR HIGH POWER THERMAL MANAGEMENT

(75) Inventors: Avijit Bhunia, Thousand Oaks, CA (US); Qingjun Cai, Thousand Oaks, CA (US); Chung-Lung Chen, Thousand Oaks, CA (US)

(73) Assignee: TELEDYNE SCIENTIFIC & IMAGING, LLC, Thousand Oaks, CA (US)

( * ) Notice: Subject to any disclaimer, the term of this patent is extended or adjusted under 35 U.S.C. 154(b) by 1792 days.

(21) Appl. No.: 13/195,515

(22) Filed: Aug. 1, 2011

(65) Prior Publication Data
US 2013/0032311 A1 Feb. 7, 2013

(51) Int. Cl.
| | |
|---|---|
| F28D 15/04 | (2006.01) |
| F28D 15/02 | (2006.01) |
| H01L 23/367 | (2006.01) |
| H01L 23/427 | (2006.01) |
| H01L 23/473 | (2006.01) |
| F28D 21/00 | (2006.01) |

(52) U.S. Cl.
CPC ....... *F28D 15/046* (2013.01); *F28D 15/0266* (2013.01); *H01L 23/3675* (2013.01); *H01L 23/427* (2013.01); *H01L 23/4735* (2013.01); *F28D 2021/0028* (2013.01); *H01L 2924/0002* (2013.01)

(58) Field of Classification Search
CPC .............. F28D 15/046; F28D 15/0266; F28D 2021/0028; H01L 23/427; H01L 23/3675; H01L 23/4735; H01L 2924/0002

USPC ........ 165/80.4, 104.25, 104.26, 104.33, 907, 165/908, 911
See application file for complete search history.

(56) References Cited

U.S. PATENT DOCUMENTS

| | | | | |
|---|---|---|---|---|
| 4,352,392 A | * | 10/1982 | Eastman | ................. F28D 15/04 165/104.25 |
| 4,931,424 A | * | 6/1990 | Henty | ................. H01L 39/2464 204/192.24 |
| 5,097,677 A | * | 3/1992 | Holtzapple | ........... F25B 31/008 62/500 |
| 5,349,831 A | * | 9/1994 | Daikoku | ............... H01L 23/427 165/80.4 |
| 5,520,244 A | | 5/1996 | Mundinger | |
| 5,687,577 A | * | 11/1997 | Ballard | ............... H01L 23/4735 257/E23.1 |
| 5,766,691 A | * | 6/1998 | Arnold | .................... F28F 13/00 165/104.33 |

(Continued)

OTHER PUBLICATIONS

A.M. Jacobi and R.K. Shah, Heat Transfer Surface Enhancement through the Use of Longitudinal Vortices: A Review of Recent Progress, Experimental Thermal and Fluid Science, 1995, pp. 295-309, vol. 11, Elsevier Science Inc., New York, USA.

(Continued)

*Primary Examiner* — Grant Moubry
*Assistant Examiner* — Kirstin Oswald
(74) *Attorney, Agent, or Firm* — K&L Gates LLP

(57) ABSTRACT

A cooling system that includes a substrate having a metallic face, at least one microporous wick formation in thermal communication with the metallic face, and a liquid delivery head positioned in complementary opposition to the metallic face, the liquid delivery head having at least one nozzle for directing a liquid towards the metallic face.

9 Claims, 2 Drawing Sheets

(56) References Cited

U.S. PATENT DOCUMENTS

| | | | | |
|---|---|---|---|---|
| 5,847,927 | A * | 12/1998 | Minning | F28F 13/003 361/696 |
| 5,924,482 | A * | 7/1999 | Edwards | F28D 15/02 165/104.21 |
| 5,943,211 | A | 8/1999 | Havey | |
| 6,064,572 | A | 5/2000 | Remsburg | |
| 6,827,135 | B1 | 12/2004 | Kramer | |
| 6,955,063 | B2 | 10/2005 | Adiga | |
| 6,994,151 | B2 | 2/2006 | Zhou | |
| 7,035,104 | B2 | 4/2006 | Meyer | |
| 7,219,715 | B2 | 5/2007 | Popovich | |
| 7,331,377 | B1 * | 2/2008 | Toy | F28F 13/185 165/80.4 |
| 7,334,630 | B2 | 2/2008 | Goodson | |
| 7,344,576 | B2 * | 3/2008 | TeGrotenhuis | B01B 1/005 165/60 |
| 7,345,877 | B2 | 3/2008 | Asfia | |
| 7,561,424 | B2 * | 7/2009 | Bjork | H01L 23/427 165/80.4 |
| 7,599,184 | B2 | 10/2009 | Upadhya | |
| 2003/0141045 | A1 * | 7/2003 | Oh | F28D 15/046 165/104.26 |
| 2005/0280128 | A1 * | 12/2005 | Mok | H01L 23/427 257/678 |
| 2006/0043534 | A1 * | 3/2006 | Kirby | H01L 21/02126 257/618 |
| 2006/0144565 | A1 * | 7/2006 | Tsai | F28D 15/0233 165/104.26 |
| 2006/0196640 | A1 * | 9/2006 | Siu | F28D 15/046 165/104.26 |
| 2007/0267180 | A1 | 11/2007 | Asfia | |
| 2008/0210406 | A1 | 9/2008 | Rini | |
| 2008/0225489 | A1 | 9/2008 | Cai | |
| 2008/0283223 | A1 * | 11/2008 | Chang | F28D 15/043 165/104.26 |
| 2009/0159243 | A1 * | 6/2009 | Zhao | F28D 15/046 165/104.26 |
| 2009/0166003 | A1 * | 7/2009 | Lai | F28D 15/0233 165/104.26 |
| 2009/0211095 | A1 * | 8/2009 | Zheng | B21C 37/151 29/890.032 |
| 2012/0048515 | A1 * | 3/2012 | Bhunia | H01L 23/3735 165/104.25 |

OTHER PUBLICATIONS

Chia-Wen Lin and Jiin-Yuh Jang, 3D Numerical heat transfer and fluid flow analysis in plate-fin and tube heat exchangers with electrohydrodynamic enhancement, Heat Mass Transfer, 2005, pp. 583-593, vol. 41, Springer-Verlag, Published online Mar. 9, 2005: DOI 10.1007/s00231-004-0540-6.

Majid Molki and Piyasak Damronglerd, Electrohydrodynamic Enhancement of Heat Transfer for Developing Air Flow in Square Ducts, Heat Transfer Engineering, 2006, pp. 35-45, vol. 27(1), Taylor & Francis Inc., London, UK.

* cited by examiner

SYSTEM FOR USING ACTIVE AND PASSIVE COOLING FOR HIGH POWER THERMAL MANAGEMENT

STATEMENT REGARDING FEDERALLY SPONSORED RESEARCH OR DEVELOPMENT

This invention was made with Government support and promoted by the Office of Naval Research under contract number N00014-07-C-0555 issued to Teledyne Scientific & Imaging, LLC. The Government has certain rights in the invention.

BACKGROUND OF THE INVENTION

Field of the Invention

This invention relates to systems for cooling electronic devices, and particularly to systems for cooling high-power devices on a direct-bonded copper (DBC) substrate.

Description of the Related Art

Power dissipation in electronic circuits remains an important design consideration and is becoming more important as performance for such circuits is becoming thermally limited. For example, a power module having multiple high power devices sitting on a substrate needs to be cooled to prevent overheating and damage to the devices as well as to better-ensure long term reliability of the devices and their power connections. Many high power modules in commercial and military use are liquid cooled by forcing liquid flow through a pin fin base plate (cold plate), with the pin fins increasing the heat transfer surface area from an otherwise flat base plate. (See U.S. Pat. Nos. 6,594,149, 7,042,725, 7,417,857, 7,353,859). Unfortunately, such systems are limited by the cooling capability of the forced convection and by thermal resistance over the base plate and solder layer. Other cooling solutions include evaporative spray cooling on custom-made base plates that have surface structures to enhance the heat transfer. (See U.S. Pat. No. 6,993,926 and US 2009/0014562). Such systems tend to be comparatively bulky and costly, however. Use of DBC substrates to mount high power devices in combination with direct impingement liquid cooling has been found to improve thermal resistance over the base plate and solder layer, but the no-fin DBC solutions suffer from substantial loss in back-side cooling surface area and so thermal dissipation is greatly limited by the liquid impingement flow rate. (See U.S. Pat. No. 7,190,581) Macro-scale fins may be attached DBC substrates, but such macro-scale fins block the liquid impingement path and are not made with commercially available DBC substrates thus adding cost to the total system solution.

A need still exists to provide for greater power dissipation for high power devices seated in power modules.

SUMMARY OF THE INVENTION

A cooling apparatus is disclosed that has, in one embodiment, a substrate having a metallic face, at least one microporous wick formation in thermal communication with the metallic face, and a liquid delivery head positioned in complementary opposition to the metallic face, the liquid delivery head having at least one nozzle for directing a liquid towards the metallic face.

A cooling method is also disclosed that includes pumping liquid through a microjet towards a thermally conductive substrate, drawing a portion of the liquid through a microporous wick structure that is thermally coupled to the thermally conductive substrate using capillary action, and removing heat from the thermally conductive substrate using liquid-to-vapor phase-change of the portion of liquid.

A fabrication method for a cooling apparatus is also disclosed that includes seating a microporous material in a frame on a substrate, seating a mold in the frame, sintering the microporous material, removing the mold to establish a microporous wick formation, assembling the microporous wick formation on the substrate in a cooling chamber, and providing a liquid delivery head in complementary opposition to the substrate.

BRIEF DESCRIPTION OF THE DRAWINGS

The components in the figures are not necessarily to scale, emphasis instead being placed upon illustrating the principals of the invention. Like reference numerals designate corresponding parts throughout the different views.

DETAILED DESCRIPTION OF THE INVENTION

A cooling system is disclosed that uses active liquid pumping and passive microporous wick structures to facilitate bubble nucleation for improved power dissipation for high power devices seated in power modules. In one embodiment, a microporous wick formation may be thermally coupled to the metallic face of a substrate. Liquid may then be pumped through a nozzle to impinge on either the microporous wick formation or on the metallic face adjacent to it. The microporous wick formation may be provided with additional structures to facilitate liquid pumping action and bubble nucleation, as described below.

Figure 1:
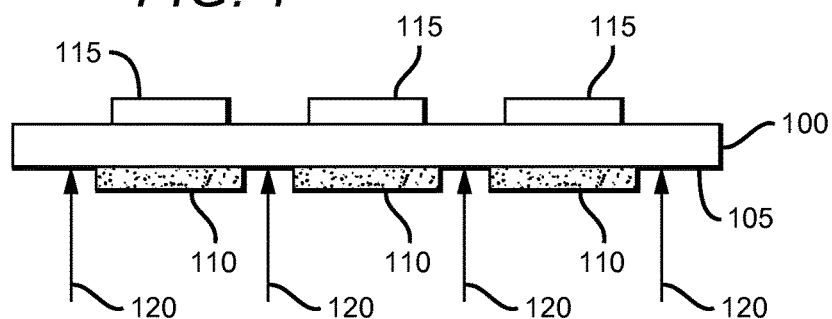
FIG. 1 is a side view of one embodiment of a cooling apparatus that uses active and passive cooling elements and with liquid impinging directly on the porous wick formations.

FIG. 1 illustrates one embodiment of a high-power module cooling apparatus that uses both active and passive elements to remove excess heat from high power devices mounted on a substrate. The substrate may be a direct bonded copper (DBC) substrate 100 that has a metallic face 105 on which are thermally coupled a plurality of microporous wick formations 110. Or, the substrate may be defined by a DBC substrate thermally coupled to a metallic plate (not shown). In one embodiment of a DBC substrate 100, the substrate may have an inner substrate, such as aluminum nitride or alumina. The board thickness may be 0.4-2 mm and with a copper thickness of 0.05-0.3 mm. High power devices 115 may be coupled to the substrate 100 on a side opposite from the porous wick formations 110, with each high power device positioned in-line with a respective one of the porous wick formations 110. The high power devices 115 may consist of any module that can benefit from the heat sink properties of the disclosed apparatus, such as a laser diode array, a compact motor controller or high density electronics, and may be thermally coupled to the substrate using a thermal coupler such as epoxy or solder. In the embodiment illustrated in FIG. 1, three high-power devices 115 are provided on the substrate 100. In other embodiments, two or more high-power devices 115 are cou-pled to the substrate 100.

Liquid streams 120 are illustrated aligned in complementary opposition to the metallic face 105 of the substrate but not aligned with any of the microporous wick formations 110 and so impinging on the metallic face between the formations. Although described herein as "streams," the word "streams" in this disclosure is intended to mean at least micro-jet streams, droplet impingement streams and other masses of liquid that are targeted to impinge on the substrate 100 using an appropriate nozzle, such as a microjet nozzle, droplet generation nozzle or other nozzle configured to target or direct liquid onto the structure.

Figure 2:
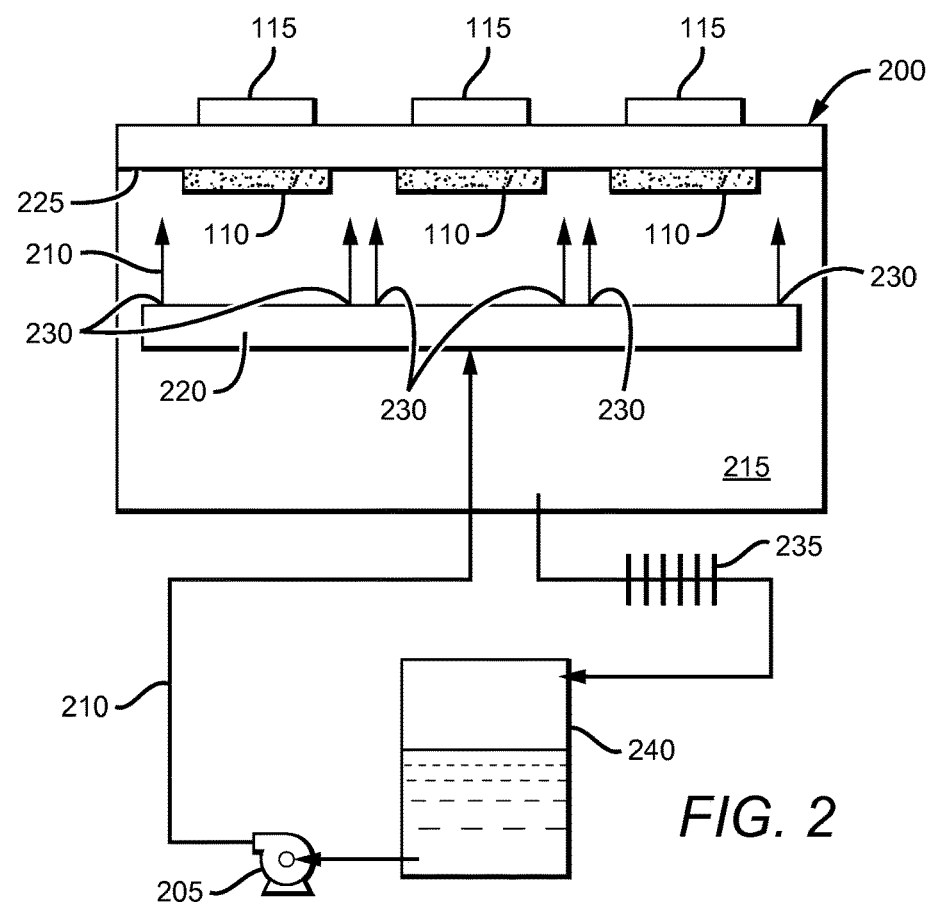
FIG. 2 is a block diagram illustrating one embodiment of a system for delivering, collecting and recirculating liquid used for the cooling apparatus first illustrated in FIG. 1.

FIG. 2 illustrates a system for delivering, collecting and re-circulating liquid used for heat transfer within the heat management system illustrated in FIG. 1. The substrate 100 is seated on a low thermal resistance cooling system 200. The high power devices 115 are thermally coupled to the substrate 100. A pump 205 pumps cooling liquid, such as water 210, into a cooling chamber 215 through a liquid delivery head such as jet head 220 that is in complementary opposition to a fluid impingement side 225 of the substrate 100. The jet head 220 has a plurality of micro-jet regions 230 that each have one or more nozzles aligned to provide respective streams of liquid towards the substrate that impinge between and/or next to respective porous wick formations. A portion of the liquid is drawn into the microporous wick structure using capillary action to absorb heat from the substrate. A liquid-to-vapor phase-change may occur to a portion of the liquid. Heated liquid and vapor produced from transfer of excess heat from the high power devices 115 to the liquid 210 is evacuated from the cooling chamber 215 and condensed through a heat exchanger 235 for storage into a tank 240 and recirculated to the jet head 220.

Figure 3:
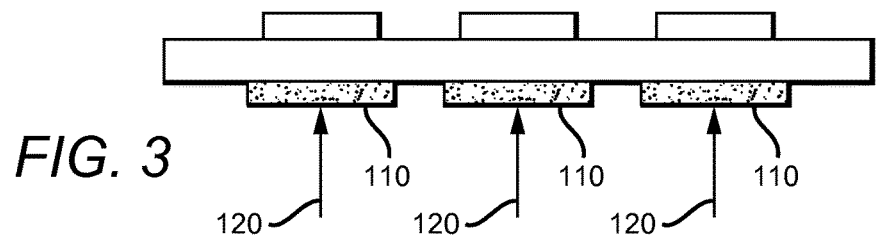
FIG. 3 illustrates the cooling apparatus first illustrated in FIG. 1, with the liquid impinging directly on the porous wick formations.

FIG. 3 illustrates an alternative embodiment of the apparatus first illustrated in FIG. 1 for use in the system illustrated in FIG. 2, with the jet head 220 (see FIG. 2) in complementary opposition to a fluid impingement side 225 of the substrate 100 and the nozzles in complementary opposition to respective microporous wick formations.

Figure 4:
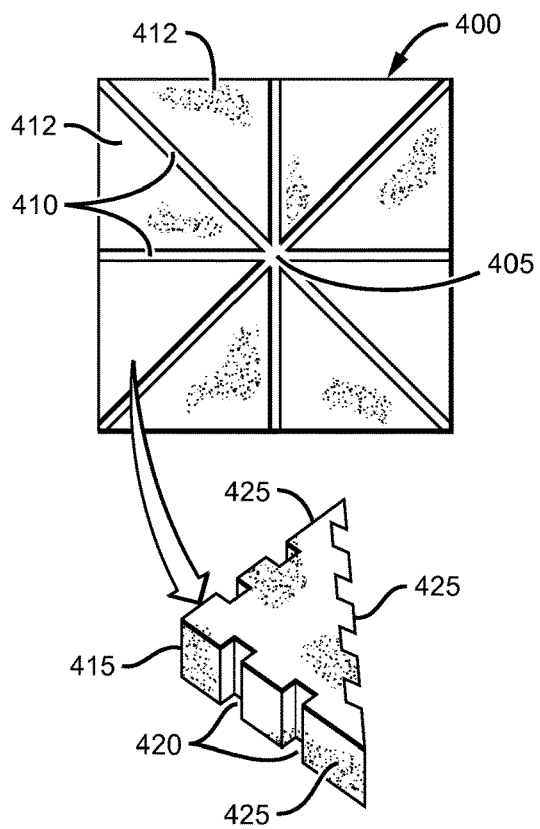
FIG. 4 is a top plan view illustrating one embodiment of a porous wick formation having a central impingement area and radially-extending liquid outflow passages.

FIG. 4 illustrates one embodiment of a porous wick formation configured to receive direct liquid impingement. In this embodiment, the microporous wick structure 400 is a bi-porous wick structure that has a central liquid impingement area 405 or "central hub" and a plurality of radially-extending macroporous channels (alternatively referred to as "passages" 410) between respective pairs of microporous wick structures 412. The passages have a thinner porous structure than the microporous wick structures 412 around them to provide liquid outflow passages, additional nucleation sites for vapor bubble generation, and additional surface area without significant temperature drop over the thin porous sections. In at least this embodiment, at least one nozzle is positioned to target the liquid directly onto the liquid impingement area 405. The thinner microporous wick structure of the passages 410 provides improved evaporation at the bubble nucleation site. The surrounding microporous wick structures 412 promote surface evaporation and in turn provide capillary pull to the liquid flowing through microporous channels illustrated as passages 410. In the process it also retains excess liquid run-off. Although the primary purpose of the bi-porous wick structure 400 is to promote surface evaporation which occurs for free surface liquid stream impingement (liquid stream injected in surrounding gas/vapor medium) only, the wick structure can be used with submerged and confined impingement (liquid stream injected in surrounding liquid) also. In case of submerged or confined impingement, the wick structure 400 can provide sites for bubble nucleation and thus promote phase change (boiling) heat transfer.

In one embodiment, the microporous wick structure 400 is formed of an open porous structure of packed particles, preferably sintered copper particles, that each has a nominal diameter of 50 microns, to enable capillary pumping pressure when introduced to a fluid. Other particle materials may be used, however, such as stainless steel, aluminum, carbon steel or other solids with reduced reactance with the chosen working fluid. Or, the microporous wick structure/formation may be formed of a sintered metallic mesh. When copper is used, the working fluid is preferably purified water, although other liquids may be used such as such as acetone or methanol. Acceptable working fluids for aluminum particles include ammonia, acetone or various freons; for stainless steel, working fluids include water, ammonia or acetone; and for carbon steel, working fluids include Naphthalene or Toluene. The ratio of passages 410 to thicker wick areas may also be changed, such as providing more or fewer channels.

In one wick structure designed to provide an enhanced heat flux capacity and improved phase change heat transfer performance, with a sintered copper particle diameter of 50 microns and purified water as a working fluid, the microporous wick structure 400 has a height of 1 mm and the passages a width of 125 microns. The dimensions of the various elements may vary. For example, passage widths can range from a millimeter to as small as 50 microns. The thinner microporous wick structure of the passages preferably has a thickness of 1-2 particles. When sintered copper particles are used to form the microporous wick structure 415, they may have a diameter in the range of 10 microns to 100 microns. Copper particles having these diameters are commercially available.

In an alternative embodiment, the microporous wick structure 412 is a bi-wick microporous wick, such as that described in U.S. patent application Ser. No. 11/960,480 entitled "Heat Pipe System" and such is incorporated by reference herein. For example, the microporous wick structure 412 may include a plurality of parallel wicking walls to communicate a working liquid in a first direction and interconnect wicks formed between and embedded with the parallel wicking walls to communicate the working liquid between the parallel wicking walls in a second direction perpendicular to the first direction so that wicking walls and interconnect wicks establish vapor vents between them to transport vapor in a direction orthogonal to the first and second directions during operation.

Also illustrated in FIG. 4 is a portion of microporous wick structure 415 that has been expanded to illustrate an alternative embodiment having notches 420 (referred to as "mesoscale" notches) formed in an outer perimeter 425 of the microporous wick structure 415. Each of the notches 420 are preferably sub-millimeter in length, with "sub-millimeter" being used herein to mean approximately hundreds of micron in width. The meso-scale notches 420 face respective passages 410 to minimize viscous drag of liquid flow due to capillary pull and to act as additional cavities for bubble nucleation sites. The meso-scale notches 420 are illustrated as generally rectangular in cross-section, but may form other cross-sectional shapes such as shapes having a triangular or semi-circular cross section.

Figure 5:
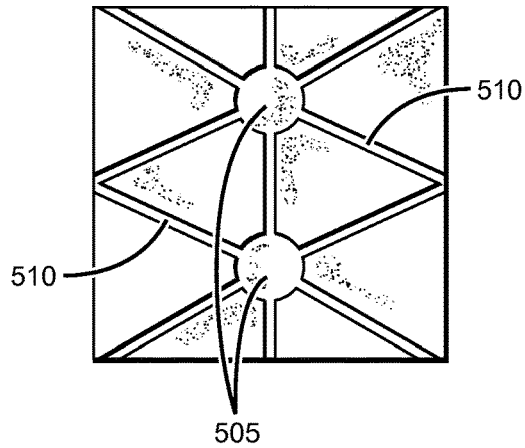
FIG. 5 is a top plan view illustrating another embodiment of the porous wick formation having multiple central impingement areas and radially-extending liquid outflow passages.

FIG. 5 illustrates another embodiment of a porous wick formation configured to receive direct liquid impingement. In this embodiment, the porous wick formation 500 has a plurality of central impingement areas 505 that each may receive a fluid stream or a plurality of fluid streams. Also illustrated are passages 510 extending from each central impingement area 505. The central impingement areas 505 are generally circular and have a thickness of 1-2 particles and a diameter of the order of a few hundreds of micron to about a millimeter. Or, the central impingement areas 505 may also be of rectangular shape to receive direct liquid impingement from a 2-D (slot) jet. The passages 510 may have a width varying between tens of micron to approximately a millimeter. In an alternative embodiment, the passages may have a width that decreases or increases as the passages extend from the central impingement area 505.

Figure 6:
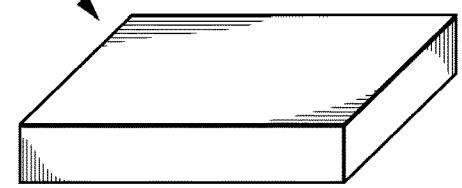
FIGS. 6-8 illustrate one embodiment of fabrication steps made to fabricate a wick structure metallic plate.
Figure 7:
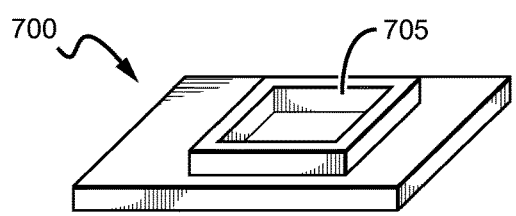
Figure 8:
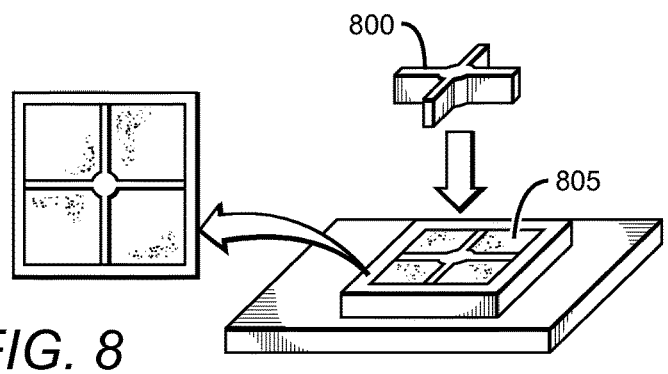

FIGS. 6 through 8 illustrate interim structures made during fabrication of a wick structured metallic plate. The plate itself can act as a substrate or may be attached to a DBC substrate. In FIG. 6, a block of copper (Cu) 600 is used as a basis for a machined metallic plate 700 that has a moat 705 to receive a porous wick formation. Or, the metallic plate 700 may be made from a metal casting process. In FIG. 8, a wick structure mold 800 and packed particles such as copper particles 805 are added to the moat 705. The wick structure mold 800 is pressed into the copper particles 805 until the mold is seated to within approximately 1-2 copper particles of the base of the moat 705. The assembly comprising the metallic plate 700, moat 705, copper particles 805 and mold 800 are introduced into an oven (not shown) in preparation for sintering to create a microporous wick structure of sintered copper particles. A vacuum is applied and the oven heated to an internal temperature of approximately 400° C. The oven is then filled with hydrogen gas at approximately 250 micro inches of mercury height. Heat is again applied to increase the internal temperature to 850-900° C. until the copper particles are sintered, and then the assembly is cooled and the mold released.

While various implementations of the application have been described, it will be apparent to those of ordinary skill in the art that many more embodiments and implementations are possible that are within the scope of this invention.

What is claimed is:

1. A thermal management apparatus, comprising:
   a substrate having a metallic face;
   at least one microporous wick formation in thermal communication with said metallic face, wherein said microporous wick formation comprises: a plurality of microporous wicks and a plurality of macroporous channels; and
   a liquid delivery head positioned in complementary opposition to said metallic face, said liquid delivery head having at least one nozzle for directing a liquid towards said metallic face.

2. The apparatus of claim 1, wherein said plurality of microporous wicks include a plurality of sub-millimeter notches on an outer perimeter of at least one of said plurality of microporous wicks.

3. A thermal management apparatus, comprising:
   a substrate having a metallic face;
   at least one microporous wick formation in thermal communication with said metallic face; and
   a liquid delivery head positioned in complementary opposition to said metallic face, said liquid delivery head having at least one nozzle for directing a liquid towards said metallic face;
   wherein said microporous wick formation comprises:
      a plurality of microporous wicks;
      a plurality of radially-extending macroporous channels between respective pairs of said plurality of microporous wicks; and
      a liquid impingement area at a central hub of said plurality of radially-extending macroporous channels.

4. The apparatus of claim 3, wherein said at least one nozzle is positioned to target the liquid directly onto said liquid impingement area.

5. The apparatus of claim 3, further comprising:
   a second plurality of microporous wicks;
   a second plurality of radially-extending macroporous channels between respective pairs of said second plurality of microporous wicks; and
   a second liquid impingement area at a central hub of said second plurality of radially-extending macroporous channels.

6. A thermal management apparatus, comprising:
   a substrate having a metallic face;
   a microporous wick formation in thermal communication with said metallic face, said microporous wick formation having a plurality of macroporous channels extending radially from a central fluid impingement area; and
   a plurality of meso-scale notches configured in a portion of said plurality of macroporous channels to minimize viscous drag of liquid flow, when a liquid is present.

7. The apparatus of claim 6, further comprising:
   a liquid delivery head in complementary opposition to said metallic face.

8. The apparatus of claim 7, wherein said liquid delivery head comprises a plurality of micro-jet regions that each have at least one nozzle aligned to provide a respective stream of liquid towards the substrate.

9. The apparatus of claim 8, wherein one of said plurality of micro-jet regions directs a stream of liquid to impinge onto said a central fluid impingement area.

* * * * *